(12) United States Patent
Sokol et al.

(10) Patent No.: US 11,395,412 B2
(45) Date of Patent: Jul. 19, 2022

(54) SYSTEMS AND METHODS OF FABRICATING SMT MOUNTING SOCKETS

(71) Applicant: Nano Dimension Technologies LTD., Nes Ziona (IL)

(72) Inventors: Daniel Sokol, Rishon l'etsion (IL); Aviram Lancovici, Rehovot (IL)

(73) Assignee: Nano Dimension Technologies, LTD., Nes Ziona (IL)

( * ) Notice: Subject to any disclaimer, the term of this patent is extended or adjusted under 35 U.S.C. 154(b) by 0 days.

(21) Appl. No.: 17/602,359

(22) PCT Filed: Apr. 8, 2020

(86) PCT No.: PCT/US2020/027151
§ 371 (c)(1),
(2) Date: Oct. 8, 2021

(87) PCT Pub. No.: WO2020/210284
PCT Pub. Date: Oct. 15, 2020

(65) Prior Publication Data
US 2022/0095461 A1    Mar. 24, 2022

Related U.S. Application Data

(60) Provisional application No. 62/830,619, filed on Apr. 8, 2019.

(51) Int. Cl.
| | | |
|---|---|---|
| H05K 1/11 | (2006.01) | |
| H05K 3/12 | (2006.01) | |
| H05K 3/34 | (2006.01) | |
| H05K 3/46 | (2006.01) | |

(52) U.S. Cl.
CPC ............. *H05K 3/125* (2013.01); *H05K 1/111* (2013.01); *H05K 3/3436* (2013.01); *H05K 3/4664* (2013.01)

(58) Field of Classification Search
CPC .......... H05K 3/125; H05K 1/111; H05K 7/20
USPC ....................................................... 228/180
See application file for complete search history.

(56) References Cited

U.S. PATENT DOCUMENTS

| | | | |
|---|---|---|---|
| 8,745,863 B2 | 6/2014 | Asai et al. | |
| 8,959,756 B2 | 2/2015 | Sakamoto et al. | |
| 2001/0042637 A1 | 11/2001 | Hirose et al. | |
| 2008/0201944 A1* | 8/2008 | Sakamoto | H01L 21/4857 29/830 |
| 2012/0006469 A1* | 1/2012 | Inagaki | H01L 23/49827 156/182 |

(Continued)

*Primary Examiner* — Stanley Tso
(74) *Attorney, Agent, or Firm* — Guy Levi; The IP Law Firm of Guy Levi, LLC

(57) ABSTRACT

The disclosure relates to systems and methods for using additive manufacturing techniques for fabricating ball grid array (BGA) surface mounting pads (SMP), and surface mounted technology devices (SMT) package sockets. More specifically, the disclosure relates to additive manufacturing methods for additively manufactured electronic (AME) circuits such as a printed circuit board (PCB), and/or flexible printed circuit (FPC), and/or high-density interconnect printed circuit board (HDIPCB) each having integrated raised and/or sunk BGA SMP, and or surface mounting sockets for SMT device(s) defined therein, and methods of coupling surface mounted devices such as BGA and/or SMT thereto.

15 Claims, 4 Drawing Sheets

(56) References Cited

U.S. PATENT DOCUMENTS

| | | | |
|---|---|---|---|
| 2016/0183409 A1* | 6/2016 | Zhou | H05K 7/20263 |
| | | | 165/104.31 |
| 2020/0028237 A1* | 1/2020 | Kim | H01Q 3/267 |
| 2020/0077530 A1* | 3/2020 | Jung | H05K 7/1432 |
| 2020/0108859 A1* | 4/2020 | Tashima | H02P 29/68 |

* cited by examiner

SYSTEMS AND METHODS OF FABRICATING SMT MOUNTING SOCKETS

BACKGROUND

The disclosure is directed to systems and methods for fabricating surface mounting pads and sockets for surface mounted (SMT) IC packaged devices in electronic circuits. These include ball grid array (BGA), and any other surface mount device. More specifically, the disclosure is directed to additive manufacturing (AM) methods for fabricating additive manufacturing electronic (AME) circuits, such as at least one of printed circuit board (PCB), flexible printed circuit (FPC) and high-density interconnect printed circuit board (HDIPCB) having integrated SMTs devices sockets and/or surface mounting pads defined therein.

Electronic devices with small form factor are increasingly in demand in all areas of, for example: manufacture, business, consumer goods, military, aeronautics, internet of things, and others. Consequently, the miniaturization of integrated circuit chips has progressed significantly, and small-sized, rectangular plate-shaped parts, some of the type having no leads, such as pin grid array (PGA) connector packages, have been coming into extensive use. Some of these types of pin grid array package structures are formed with solder balls (or solder bumps) on their basal surface rather than with external terminal pins and are referred to as "ball grid arrays" (BGA) packages.

In addition, the electronic package industry applications, such as those applications discussed above are widely utilizing surface mounting technology (SMT) connectors to improve printed circuit's wiring density, impedance matching, and path length concerns. New mechanical requirements emerge from the SMT connector technology due to assembly constraints of these ever-miniaturized SMT interface(s) with relatively tight tolerances, compared with previous and more mechanically robust and fault tolerant pin or pin-through-hole interface technologies, utilized in previous applications where the form factor was less of a concern, or where the fabrication technology was the.

SMT packages (including BGA) of this type can have small outer dimensions. For example, a BGA package having 165 solder bells on its basal surface may have dimensions of about 23.0 mm (in length)×23.0 mm (in width)×2.13 mm (in thickness). With these dimensions, it is difficult to ensure proper coupling onto the surface mounting pads.

Typical method for placing solder bumps on surface mounting pads on a substrate, uses a stencil plate placed over the surface mounting pads on the substrate, to guide either a solder paste, or solder balls to flow through openings in the stencil plate onto the surface mounting pads. The solder paste, or solder balls can be spread or distributed over the stencil (e.g., using a squeegee (e.g., a resilient wiper blade), to evenly distribute the solder paste as well as removing the excess solder paste). After the stencil is removed from the substrate, solder bumps are formed on; and remain attached to, the surface mounting pads. This method forms the solder bumps on the surface mounting pads and does not place solder that has been pre-formed on the surface mounting pads. Another method for placing solder balls on surface mounting pads on a substrate, uses tubes to hold the solder balls over the surface mounting pads. Each tube applies a vacuum force to hold a single solder ball at the end of the tube. After placing the tubes holding the solder balls over the corresponding surface mounting pads, the solder balls are placed on the surface mounting pads by removing the vacuum and vertically vibrating the tubes to release the solder balls onto the surface mounting pads. Both methods (and others) do not address the accuracy needed in coupling the leads, legs or ball grid of the integrated chip packages—onto the surface mounting pads on the wiring circuit in an effective and efficient manner.

The present disclosure is directed toward overcoming one or more of the above-identified shortcomings by the use of additive manufacturing technologies and systems.

SUMMARY

Disclosed, in various embodiments, are additive manufacturing (AM) methods for fabricating additive manufacturing electronic (AME) circuits, such as at least one of: a printed circuit board (PCB), a flexible printed circuit (FPC), and a high-density interconnect printed circuit board (HDIPCB), each having integrated BGA sockets defined therein.

In an embodiment provided herein is an additively manufactured electronic (AME) circuit, that is at least one of: a printed circuit board (PCB), a flexible printed circuit (FPC), and a high-density interconnect printed circuit board (HDIPCB), the AME circuit having at least one external surface comprising at least one of: a sunk pit having side walls extending internally from the outer surface of the AME circuit, to a pit floor wherein the floor defines a well array having a plurality of wells, each configured to receive and accommodate a soldering medium, and a raised frame (in other words, framing the pit) having side walls extending externally (e.g., apically, basally, or laterally) from the outer (apical, basal, lateral) surface(s) of the AME circuit, the raised frame defining a framed pit having side walls and a floor, the floor defining a well array, configured to receive and accommodate the soldering medium,, wherein, each of the sunk pit and the raised framed pit, having the well array defined therein is sized and configured to operably couple at least one of: a ball grid array (BGA) package (referring to the components' physical shape, footprint or outline), and a surface mounted device (SMT) package.

In another embodiment, the raised framed pit has a partial frame and the pit floor further defines grooves, or channels, interconnecting the plurality of the wells, the grooves (or channels) operable to maintain fluid communication among the plurality of wells, configured to collect (and provide for drainage of) excess solder reflow material, such as, for example, solder flux.

In yet another embodiment, provided herein is a method for fabricating additively manufactured electronic (AME) circuit, that is at least one of: a printed circuit board (PCB), a flexible printed circuit (FPC), and a high-density interconnect printed circuit board (HDIPCB), each comprising at least one of: a sunk pit having side walls, extending internally from an outer (apical, basal, lateral) surface of the AME circuit, to a pit floor wherein the floor defines a well array, configured to receive and accommodate a soldering medium, and raised frame having side walls extending externally from the outer (apical, basal, lateral) surface of the AME circuit, the raised frame defining a raised framed pit having side walls and a floor, the floor defines the well array, configured to receive and accommodate the soldering medium, wherein, each one of the sunk pit and the raised framed pit, is operable to couple at least one of a ball grid array (BGA) package, and a surface mounted technology (SMT) package, the method comprising: providing an ink jet printing system having: a first print head adapted to dispense a dielectric ink; a second print head adapted to dispense a conductive ink; a conveyor, operably coupled to the first and second print heads, configured to convey a substrate to each print heads; and a computer aided manufacturing ("CAM") module, in communication with each of the first, and second print heads, the CAM further comprising a central processing module (CPM) including at least one processor in communication with a non-transitory computer readable storage device configured to store instructions that, when executed by the at least one processor cause the CAM to control the ink-jet printing system, by carrying out steps that comprise: receiving a 3D visualization file representing the AME circuit comprising the at least one of: the sunk pit, and the raised frame pit; and generating a file library having a plurality of files, each file representing a substantially 2D layer for printing the AME circuit comprising the at least one of: the sunk pit, and the raised frame pit, and a metafile representing at least the printing order; providing the dielectric inkjet ink composition, and the conductive inkjet ink composition; using the CAM module, obtaining from the library the first layer file; using the first print head, forming the pattern corresponding to the dielectric inkjet ink; curing the pattern corresponding to the dielectric inkjet ink; using the second print head, forming the pattern corresponding to the conductive ink, the pattern further corresponding to the substantially 2D layer for printing of the AME circuit comprising the at least one of: the sunk pit, and the raised frame pit; sintering the pattern corresponding to the conductive inkjet ink; using the CAM module, obtaining from the library a subsequent file representative of a subsequent layer for printing the AME circuit comprising the at least one of: the sunk pit, and the raised frame pit; the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon printing the final layer, forming the AME circuit comprising the at least one of: the sunk pit, and the raised frame pit.

It is noted, that the library comprises computer aided design (CAD)-generated layout of traces and dielectric insulating (DI) material, and the metafile required for their retrieval, including for example, labels, printing chronological order and other information needed for using in the additive manufacturing systems utilized.

The well array in the raised and/or sunk pits is operable as a surface mounting pad and is sized (in other words, having the right surface cross section and side wall pitch, or spatial orientation), and adapted to receive and accommodate leads (e.g., legs (J-type, wing-type, T-type for example), bumps spheres and the like) of various SMT devices, whereby each well, or surface mounting pad is configured to communicate (in other words, maintain electronic contact), with a target component.

In yet another embodiment, provided herein is an AME circuit of at least one of: a printed circuit board (PCB), a flexible printed circuit (FPC), and a high-density interconnect printed circuit board (HDIPCB), each comprising an integrally fabricated BGA socket, sized and configured to operably couple to a BGA chip package.

These and other features of the systems, and methods for fabricating ball grid array (BGA) package sockets, will become apparent from the following detailed description when read in conjunction with the figures and examples, which are exemplary, not limiting.

BRIEF DESCRIPTION OF THE FIGURES

For a better understanding of the systems and methods for additive manufacturing of AME circuits with integral ball grid array (BGA) package sockets, and their fabrication compositions, with regard to the embodiments thereof, reference is made to the accompanying examples and figures, in which.

DETAILED DESCRIPTION

Figure 1:
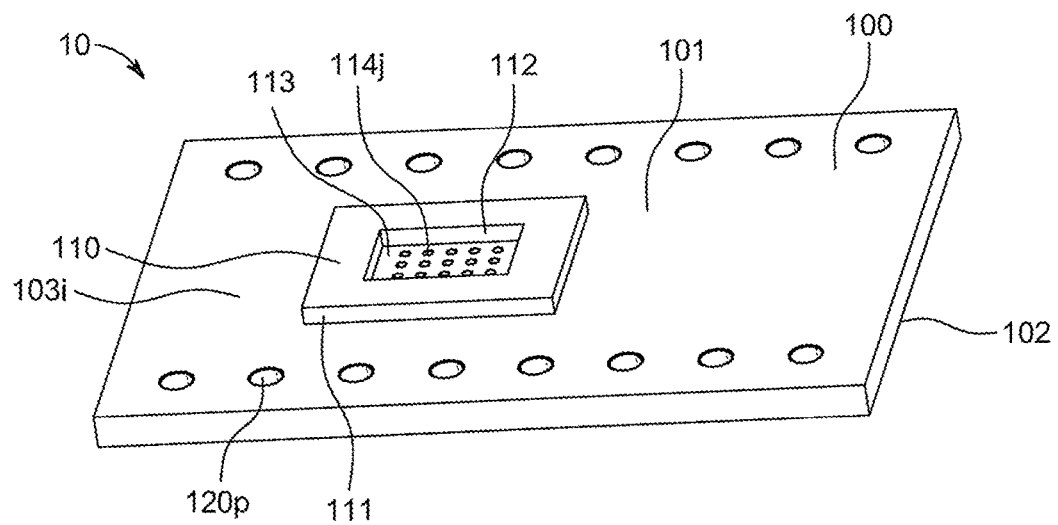
FIG. 1, is a top isometric perspective schematic view of a printed circuit fabricated using the disclosed methods.

Provided herein are embodiments of systems and methods for fabricating ball grid array (BGA) and SMT package sockets. More specifically, provided herein are embodiments of additive manufacturing methods for fabricating AME circuit of at least one of: printed circuit board (PCB), flexible printed circuit (FPC), and high-density interconnect printed circuit board (HDIPCB) having at least one of: a BGA package socket and/or SMT socket.

Ball grid array (BGA) as used herein, refers in an embodiment to a surface mounted package (an integrated chip (IC) carrier), used to couple integrated chips to the AME circuit. Moreover, typical soldering of BGA connector package is done at 250° C. for about 30 seconds. Solder paste, used at these temperature, can develop internal structural defects, such as voids, or density variation of fused solder volumes during the fusing process, thereby introducing potential defects to the manufacturing process and/or risk of failure during the life of the product. Moreover, solder balls when used, need to be precisely positioned on the surface mounting pads, to ensure contact between the leads (legs) or solder balls of the BGA connector package to the solder junction (and the contact pad). When it is desired to have the process at lower temperature, for example between about 120° C., and about 160° C., it is beneficial to have the solder balls (or leads) be positioned exactly over the surface mounting pads.

The term "Solder balls" is used herein to refer to the various form factors of conductive preforms on the chip package fitted onto the fabricated socket, whether it is leads (legs), solder bumps, solder spheres and the like.

Here, the systems, methods and compositions described herein can be used to form/fabricate AME circuits of at least one of: PCB, FPC and HDIPCB boards, comprising integrated BGA connector sockets, optionally coupled to BGA chip packages, utilizing a combination of print heads with conductive and dielectric ink compositions in a single, continuous additive manufacturing process (pass), using for example, an inkjet printing device, or using several passes. Using the systems, methods and compositions described herein, a dielectric resin material can be used to form the insulating and/or dielectric portion of the printed AME circuits (see e.g., 100 FIG. 1). This printed dielectric inkjet ink (DI) material is printed in optimized shape including accurate wells (in other words, surface mounting pads (see e.g., 114j, FIG. 2B) that can be either sunk into the outer (apical, basal, or lateral) surface(s) of the printed circuit, raised above in a frame 110, or any combination, whereby the frame can be complete 110 or partial (see e.g., 110', FIG. 4).

While reference is made to inkjet inks, other additive manufacturing methods (also known as rapid prototyping, rapid manufacturing, and 3D printing), are also contemplated in the implementation of the disclosed methods. In the exemplary implementation, the AME circuits, comprising the at least one framed pit, and/or at least one sunk pit; can likewise be fabricated by a selective laser sintering (SLS) process, direct metal laser sintering (DMLS), electron beam melting (EBM), selective heat sintering (SHS), or stereolithography (SLA). The AME circuits, comprising e.g., BGA connector package sockets, may be fabricated from any suitable additive manufacturing material, such as metal powder(s) (e.g., cobalt chrome, steels, aluminum, titanium and/or nickel alloys), gas atomized metal powder(s), thermoplastic powder(s) (e.g., polylactic acid (PLA), acrylonitrile butadiene styrene (ABS), and/or high-density polyethylene (HDPE)), photopolymer resin(s) (e.g., UV-curable photopolymers such as, for example PMMA), thermoset resin(s), thermoplastic resin(s), flexible dielectric material, flexible conductive material, and/or any other suitable material that enables the functionality as described herein.

The systems used can typically comprise several sub-systems and modules. These can be, for example: additional conductive and dielectric print-heads, a mechanical subsystem to control the movement of the print heads, the chuck, its heating and conveyor motions; the ink composition injection systems; the curing/sintering sub-systems; a computerized sub-system with at least one processor or CPU that is configured to control the process and generates the appropriate printing instructions, a component (e.g., the BGA/SMT packages) placement system such as automated robotic arm, a hot air knife for soldering, a machine vision system, and a command and control system to control the 3D printing. In addition, an additional print head can be used to dispense the soldering past directly into well array 114j.

Accordingly and in an exemplary implementation, provided herein is a method for fabricating at least one of: a printed circuit board (PCB), a flexible printed circuit (FPC), and a high-density interconnect printed circuit board (HDI-PCB), each comprising at least one of: a sunk pit having side walls, extending internally from an outer surface of the at least one of the PCB, FPC and HDIPCB, to a pit floor wherein the floor defines a well array, configured to receive and accommodate a soldering medium, and raised frame having side walls extending externally from the outer surface of the at least one of the PCB, FPC and HDIPCB, the raised frame defining a raised framed pit having side walls and a floor, wherein the floor defines the well array, configured to receive and accommodate the soldering medium, wherein, each one of the sunk pit and the raised framed pit, is sized and configured to operably couple at least one of a ball grid array (BGA) package, and a surface mounted technology (SMT) package, the method comprising: providing an ink jet printing system having: a first print head adapted to dispense a dielectric ink; a second print head adapted to dispense a conductive ink; a conveyor, operably coupled to the first and second print heads, configured to convey a substrate to each print heads; and a computer aided manufacturing ("CAM") module in communication with the first print head, the second print heads, and the conveyor, the CAM module comprising: at least one processor; a non-volatile memory storing thereon a set of executable instructions, configured, when executed to cause the at least one processor to: receive a 3D visualization file representing the at least one of: the sunk pit, and the raised frame pit; using the 3D visualization file, generate a library comprising a plurality of layer files, each layer file representing a substantially 2D layer for printing of at least one of PCB, FPC and HDIPCB comprising the at least one of: the at least one of: the sunk pit, and the raised frame pit; using the library, generate a conductive ink pattern comprising the conductive portion of each of the layer files for printing the conductive portion of the at least one of PCB, FPC and HDIPCB; using the library, generate the ink pattern corresponding to the dielectric ink portion of each of the layer files for printing a dielectric portion of the at least one of PCB, FPC and HDIPCB, wherein the CAM module is configured to control each of the first and the second print heads; providing the dielectric ink composition, and the conductive ink composition; using the CAM module, obtaining the first layer file; using the first print head, forming the pattern corresponding to the dielectric ink, the dielectric pattern further corresponding to the substantially 2D layer for printing of the at least one of: the sunk pit, and the raised framed pit; curing the pattern corresponding to the dielectric ink of the substantially 2D layer; using the second print head, forming the pattern corresponding to the conductive ink, the conductive pattern further corresponding to the substantially 2D layer for printing of the at least one of: the sunk pit, and the raised framed pit; and sintering the pattern corresponding to the conductive ink.

IN addition and in another exemplary implementation, provided herein is a method for fabricating additively manufactured electronic (AME) circuit, that is at least one of: a printed circuit board (PCB), a flexible printed circuit (FPC), and a high-density interconnect printed circuit board (HDI-PCB), each comprising at least one of: a sunk pit having side walls, extending internally from an outer (apical, basal, lateral) surface of the AME circuit, to a pit floor wherein the floor defines a well array, configured to receive and accommodate a soldering medium, and raised frame having side walls extending externally from the outer (apical, basal, lateral) surface of the AME circuit, the raised frame defining a raised framed pit having side walls and a floor, the floor defines the well array, configured to receive and accommodate the soldering medium, wherein, each one of the sunk pit and the raised framed pit, is operable to couple at least one of a ball grid array (BGA) package, and a surface mounted technology (SMT) package, the method comprising: providing an ink jet printing system having: a first print head adapted to dispense a dielectric ink; a second print head adapted to dispense a conductive ink; a conveyor, operably coupled to the first and second print heads, configured to convey a substrate to each print heads; and a computer aided manufacturing ("CAM") module, in communication with each of the first, and second print heads, the CAM further comprising a central processing module (CPM) including at least one processor in communication with a non-transitory computer readable storage device configured to store instructions that, when executed by the at least one processor cause the CAM to control the ink-jet printing system, by carrying out steps that comprise: receiving a 3D visualization file representing the AME circuit comprising the at least one of: the sunk pit, and the raised frame pit; and generating a file library having a plurality of files, each file representing a substantially 2D layer for printing the AME circuit comprising the at least one of: the sunk pit, and the raised frame pit, and a metafile representing at least the printing order;

providing the dielectric inkjet ink composition, and the conductive inkjet ink composition; using the CAM module, obtaining from the library the first layer file; using the first print head, forming the pattern corresponding to the dielectric inkjet ink; curing the pattern corresponding to the dielectric inkjet ink; using the second print head, forming the pattern corresponding to the conductive ink, the pattern further corresponding to the substantially 2D layer for printing of the AME circuit comprising the at least one of: the sunk pit, and the raised frame pit; sintering the pattern corresponding to the conductive inkjet ink; using the CAM module, obtaining from the library a subsequent file representative of a subsequent layer for printing the AME circuit comprising the at least one of: the sunk pit, and the raised frame pit; the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon printing the final layer, forming the AME circuit comprising the at least one of: the sunk pit, and the raised frame pit.

It should be noted however, that all of these and similar terms are to be associated with the appropriate physical quantities and are merely convenient labels applied to these quantities. Unless specifically stated otherwise as apparent from the following discussions, it should appreciated that throughout the disclosure, discussions utilizing terms such as "generating", or "obtaining", "rendering", or "causing", or "allowing", "accessing" or "placing" or "forming" or "mounting" or "removing" or "attaching" or "processing" or "singulating" or "performing" or "generating" or "adjusting" or "creating" or "executing" or "continuing" or "calculating" or "determining" or the like, refer to the action and processes of, or under the control of, a computer system's processor, or similar electronic computing device, that manipulates and transforms data represented as physical (electronic) quantities within the computer system's registers, libraries, databases and memories into other data similarly represented as physical quantities within the computer system memories or registers or other such information storage, transmission or display devices.

Furthermore, the set of executable instructions are further configured, when executed, to cause the at least one processor to: using the 3D visualization file, generate a library of a plurality of subsequent layers' files, wherein each subsequent layer file is indexed by printing order, such that each subsequent layers' file represents a substantially two dimensional (2D) subsequent layer for printing a subsequent portion of the AME circuit comprising the at least one of: the sunk pit, and the raised frame pit, operable to couple BGA connector package and/or SMT device leads, such that when printing of the 2D library (of raster files, vector files and the like) ends, the resulting AME circuit, will comprise at least one functional BGA connector package socket and/or at least one functional SMT device socket, whereby all wells in the well arrays are connected to their predetermined destination on and in the AME circuit.

The use of the term "module" does not imply that the components or functionality described or claimed as part of the module are all configured in a (single) common package. Indeed, any or all of the various components of a module, whether control logic or other components, can be combined in a single package or separately maintained and can further be distributed in multiple groupings or packages or across multiple (remote) locations and devices. Furthermore, in certain embodiments, the term "module" refers to a monolithic or distributed hardware unit(s).

Furthermore, in relation to systems, methods, AME circuits and programs, the term "operable" means the system and/or the device and/or the program, or a certain element or step is/are fully functional sized, adapted and calibrated, comprises elements for, and meets applicable operability requirements to perform a recited function when activated, coupled, implemented, effected, realized or when an executable program is executed by at least one processor associated with the system and/or the device. In relation to systems and AME circuits, the term "operable" means the system and/or the circuit is fully functional and calibrated, comprises logic for, and meets applicable operability requirements to perform a recited function when executed by at least one processor.

In an embodiment, the term "dispense", in the context of the first print-head is used to designate the device from which the ink drops are dispensed. The dispenser can be, for example an apparatus for dispensing small quantities of liquid including micro-valves, piezoelectric dispensers, continuous-jet print-heads, boiling (bubble-jet) dispensers, and others affecting the temperature and properties of the fluid flowing through the dispenser.

Accordingly and in an exemplary implementation, the AM methods implemented using the systems, programs and compositions to form/fabricate the AME circuit comprising at least one of: a sunk pit having side walls. extending internally from, or flush with an outer (apical, basal, or lateral) surface of the AME circuit, to a pit floor wherein the floor defines a well array having a plurality of wells (the pit being interchangeable with surface mounting pads, and/or socket), each well configured to receive and accommodate a soldering medium, and a raised frame having side walls extending externally from the outer surface of the AME circuit, the raised frame defining a framed pit having side walls and a floor, wherein the floor defines a well array having a plurality of wells, each configured to receive and accommodate a soldering medium, wherein, each of the sunk pit and the raised framed pit, having the well array defined therein is operable as a socket or as a surface mounting pad; and is sized and configured to operably couple at least one ball grid array (BGA) connector chip package, and/or at least one SMT device package.

The term "chip" refers to a non-packaged, singulated, integrated circuit (IC) device. The term "chip package" may particularly denote a housing that chips come in, used for plugging into (socket mount, see e.g., 220, FIG. 5A) or soldering onto (surface mounting pad see e.g., 210, FIG. 5A) a circuit board, thus creating BGA connector socket, and/or SMT device socket adapted, sized and configured to accommodate a chip package. In electronics, the term chip package or chip carrier may denote the material added around a component or the singulated IC to allow it to be handled without damage and incorporated into a circuit. Furthermore, the chip package used in conjunction with the systems, methods and compositions described herein can be Quad Flat Pack (QFP) package, a Thin Small Outline Package (TSOP), a Small Outline Integrated Circuit (SOIC) package, a Small Outline J-Lead (SOJ) package, a Plastic Leaded Chip Carrier (PLCC) package, a Wafer Level Chip Scale Package (WLCSP), a Mold Array Process-Ball Grid Array (MAPBGA) package, a Ball-Grid Array (BGA), a Quad Flat No-Lead (QFN) package, a Land Grid Array (LGA) package, a passive component, or a combination comprising two or more of the foregoing.

The CAM module can therefore comprise a non-transitory memory device, storing thereon: a 2D file library storing the files converted from the 3D visualization files of the AME circuits comprising the BGA connector sockets, and/or the lead containing SMT device sockets. The term "library, as used herein, refers to the collection of 2D layer files derived from the 3D visualization file by at least one processor included in the CAM module, containing the information necessary to print each conductive and dielectric pattern, which is accessible and used by the CPM, and which can be executed by the processor-readable media. The CAM further comprises at least one processor in communication with the library; the non-transitory memory device storing a set of operational instructions for execution by the at least one processor; a micromechanical inkjet print head or heads in communication with the CPM and with the library; and a print head (or, heads') interface circuit in communication with the 2D file library, the memory and the micromechanical inkjet print head or heads, the 2D file library configured to provide printer operation parameters specific to a functional layer. It is noted that the term "functional layer", refers to any layer captured by a file in the library, regardless of the amount of conductive or dielectric material used for that layer.

In certain configurations, the systems provided herein further comprise a hot air knife, or a electromagnetic radiation source, used for example to solder the paste or solder balls.

In an exemplary implementation, the methods for fabricating the printed circuits described herein, further comprise, upon printing of all subsequent layers (e.g., upon completion of the layer files in the library): applying soldering medium (e.g., soldering paste having a low melting point or solder balls having low melting point) to the well array of the at least one of the sunk pit and the raised framed pit; optionally applying solder reflow material (e.g., solder flux), either to the BGA connector package, or to the solder paste; coupling the BGA connector package, or the leaded (having legs, or leads, NOT meaning made out of lead) SMT device to the at least one of the raised framed pit and the sunk pit, wherein the BGA connector package or the leaded SMT device, further comprise a plurality of basally extending extensions (in other words, legs, or leads), soldering bumps, soldering spheres, leads and the like, each configured to partially enter a corresponding well (and/or abut the well or surface mounting pad), or partially enter a recess configured to receive and engage a lead: and soldering the BGA connector package and/or the SMT device package. The solder paste used can also comprise spheres of about 30 μm of the soldering alloy, mixed with flux, solvents, and thixotropic materials.

To clarify, BGA connector package refers to those IC packages (see e.g., FIG. 5E, 5F) having at least one of: soldering bumps, pin-grid array, soldering spheres, and quad flat-no leads. Whereas, leaded SMT device packages refer to IC packages having leads, such as, for example J-type, wing-type, T-type, extending typically from a lateral wall, and cover the periphery of the SMT device package (see e.g., FIG. 5B-5D).

To form a successful interconnection it may be necessary to apply a fluxing material. A number of different alternatives have been used. For example solid flux material can be used within the soldering material itself. Generally such a soldering material would then be provided in a wire or other such solid form which would incorporate a core of flux material running through the solder. As the solder melts upon heating, the flux is activated, and the resulting interconnect formed if the soldering process is of an acceptable standard. Such solid flux-containing material can be provided in the form of soldering balls that can be placed in the wells (or surface mounting pads (SMPs)). Another example can be a flux in the form of a tacky fluid referring to a fluid that can be applied by a pick-and-dip process but which is sufficiently tacky to remain in place on a dipped component for subsequent soldering (in other words, applied directly to the solder bumps of the BGA connector package, or the PGA connector package). Providing a flux material which achieves a number of functions is desirable. For example, the flux material should provide good surface activation. In this respect, it has been known to include an activator component within the flux material which will act to remove oxidized material from a metal surface, thereby allowing better solder to metal interconnection and ultimately metal (PCB) to metal (electronic component) interconnection. Another parameter, is creating the proper surface tension between the soldering material and the SMPs walls (See e.g., FIG. 2B), to ensure proper contact with the BGA chip package leads or other soldering form factor (e.g., solder spheres and the like).

Accordingly and in an embodiment, in the method for fabricating a printed circuit having at least one of: a raised framed (or partially framed) pit, and a sunk pit forming a BGA connector package socket, or a leaded SMT device socket e.g., SMP), the pattern corresponding to the dielectric portion of the at least one of the sunk pit floor and the raised framed pit floor, is configured to further print a groove or a groove pattern, whereby the groove or grooves' network, when fully printed, is operable to receive the solder reflow material and wherein the grooves maintain fluid communication among a plurality of wells, and the soldering medium is a soldering paste and wherein the step of applying the soldering material is followed by a step of removing excess paste.

Also, the wells, or surface mounting pads (SMPs) can be a solder mask defined BGA pad, and/or a non-solder mask defined BGA pad. Solder mask defined (SMD) pads, are defined for example, by the solder mask apertures applied to the BGA pads. SMD pads have the solder mask apertures (see e.g., non SMD BGA (NSMD) pad in FIG. 2B) specified such that the opening in the mask ($r_{ext}$) is smaller than the diameter of the pad ($r_{int}$) that they cover, effectively shrinking the size of the conductive pad printed, which the component (in other words, the BGA chip package solder ball, solder bump, or pin of the PGA and other form factors as described herein) will be soldered to. Additionally or alternatively, NSMD pads differ from SMD pads as the solder mask is defined to not make contact with the conductive portion of the pad. Instead, the mask is created such that a gap is created between the edge of the pad and the solder mask.

In an embodiment, the depth of the pit is between about 0.25 mm and about 1.00 mm, or between about 0.30 mm and about 0.80 mm, for example between about 0.40 mm and about 0.60 mm, or between about 0.45 mm and about 0.55 mm, while the well depth is between about 50 μm, and about 150 μm, or between about 60 μm, and about 120 μm, for example, between about 70 μm, and about 100 μm, or between about 75 μm, and about 85 μm.

Furthermore, each of the wells in the well array of the AME circuits fabricated using the methods disclosed with the systems and programs, is coupled to a plated, or filled one of: a through hole via, a blind via, or a buried via, operable to couple the BGA connector package as needed to ensure operability.

In an embodiment, the first conductive ink can contain silver, while an additional ink can contain copper, thus allowing printing of integral, built-in surface mounting pads, or connectors having silver traces, with copper solder junctions.

The term "forming" (and its variants "formed", etc.) refers in an embodiment to pumping, injecting, pouring, releasing, displacing, spotting, circulating, or otherwise placing a fluid or material (e.g., the conducting ink) in contact with another material (e.g., the substrate, the resin or another layer) using any suitable manner known in the art.

Curing the insulating and/or dielectric layer or pattern deposited by the appropriate print head as described herein, can be achieved by, for example, heating, photopolymerizing, drying, depositing plasma, annealing, facilitating redox reaction, irradiation by ultraviolet beam or a combination comprising one or more of the foregoing. Curing does not need to be carried out with a single process and can involve several processes either simultaneously or sequentially, (e.g., drying and heating and depositing crosslinking agent with an additional print head)

Furthermore, and in another embodiment, crosslinking refers to joining moieties together by covalent bonding using a crosslinking agent, i.e., forming a linking group, or by the radical polymerization of monomers such as, but not limited to methacrylates, methacrylamides, acrylates, or acrylamides. In some embodiment, the linking groups are grown to the end of the polymer arms.

Therefore, in an embodiment, the vinyl constituents are monomers comonomers, and/or oligomers selected from the group comprising a multi-functional acrylate, their carbonate copolymers, their urethane copolymers, or a composition of monomers and/or oligomers comprising the foregoing. Thus, the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl)isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunctional acrylate composition comprising one or more of the foregoing In an embodiment, the term "copolymer" means a polymer derived from two or more monomers (including terpolymers, tetrapolymers, etc.), and the term "polymer" refers to any carbon-containing compound having repeat units from one or more different monomers.

Other functional heads may be located before, between or after the inkjet ink print heads used in the systems for implementing the methods described herein. These may include a source of electromagnetic radiation configured to emit electromagnetic radiation at a predetermined wavelength ($\lambda$), for example, between 190 nm and about 400 nm, e.g. 395 nm which in an embodiment, can be used to accelerate and/or modulate and/or facilitate a photopolymerizable insulating and/or dielectric that can be used in conjunction with metal nanoparticles dispersion used in the conductive ink. Other functional heads can be heating elements, additional printing heads with various inks (e.g., support, pre-soldering connective ink, label printing of various components for example capacitors, transistors and the like) and a combination of the foregoing.

Other similar functional steps (and therefore the support systems for affecting these steps) may be taken before or after each of the DI or metallic conducting inkjet ink print heads (e.g., for sintering the conducting layer). These steps may include (but not limited to): a soldering step (affected by a heating element, or hot air); photobleaching (of a photoresist mask support pattern), photocuring, or exposure to any other appropriate actininc radiation source (using e.g., a UV light source); drying (e.g., using vacuum region, or heating element); (reactive) plasma deposition (e.g., using pressurized plasma gun and a plasma beam controller); cross linking such as by using cationic initiator e.g. [4-[(2-hydroxytetradecyl)-oxyl]-phenyl]-phenyliodonium hexafluoro antimonate to a flexible resin polymer solutions or flexible conductive resin solutions; prior to coating; annealing, or facilitating redox reactions and their combination regardless of the order in which these processes are utilized. In certain embodiment, a laser (for example, selective laser sintering/melting, direct laser sintering/melting), or electron-beam melting can be used on the rigid resin, and/or the flexible portion. It should be noted, that sintering of the conducting portions can take place even under circumstances whereby the conducting portions are printed on top of a rigid resinous portion of the printed circuit boards including built-in passive and embedded active components described herein component.

Formulating the conducting ink composition may take into account the requirements, if any, imposed by the deposition tool (e.g., in terms of viscosity and surface tension of the composition) and the deposition surface characteristics (e.g., hydrophilic or hydrophobic, and the interfacial energy of the substrate or the support material (e.g., glass) if used), or the substrate layer on which consecutive layers are deposited. For example, the viscosity of either the conducting inkjet ink and/or the DI (measured at the printing temperature ° C.) can be, for example, not lower than about 5 cP, e.g., not lower than about 8 cP, or not lower than about 10 cP, and not higher than about 30 cP, e.g., not higher than about 20 cP, or not higher than about 15 cP. The conducting ink, can each be configured (e.g., formulated) to have a dynamic surface tension (referring to a surface tension when an ink-jet ink droplet is formed at the print-head aperture) of between about 25 mN/m and about 35 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate, the support material, the resin layer(s), or their combination, of between about 100° and about 165°.

In an embodiment, the term "chuck" is intended to mean a mechanism for supporting, holding, or retaining a substrate or a workpiece. The chuck may include one or more pieces. In one embodiment, the chuck may include a combination of a stage and an insert, a platform, be jacketed or otherwise be configured for heating and/or cooling and have another similar component, or any combination thereof.

In an embodiment, the ink-jet ink compositions, systems and methods allowing for a direct, continuous or semi-continuous ink-jet printing to form/fabricate the AME circuits described, comprising the integrally fabricated BGA connector package SMPs, and/or SMT devices' sockets. can be patterned by expelling droplets of the liquid ink-jet ink provided herein from an orifice one-at-a-time, as the print-head (or the substrate) is maneuvered, for example in two (X-Y) (it should be understood that the print head can also move in the Z axis) dimensions at a predetermined distance above the removable substrate or any subsequent layer. The height of the print head can be changed with the number of layers, maintaining for example a fixed distance. Each droplet can be configured to take a predetermined trajectory to the substrate on command by, for example a pressure impulse, via a deformable piezo-crystal in an embodiment, from within a well operably coupled to the orifice. The printing of the first inkjet metallic ink can be additive and can accommodate a greater number of layers. The ink-jet print heads provided used in the methods described herein can provide a minimum layer film thickness equal to or less than about 0.3 µm-10,000 µm The conveyor maneuvering among the various print heads used in the methods described and implementable in the systems described can be configured to move at a velocity of between about 5 mm/sec and about 1000 mm/sec. The velocity of the e.g., chuck can depend, for example, on: the desired throughput, the number of print heads used in the process, the number and thickness of layers of the printed circuit boards including built-in passive and embedded active components described herein printed, the curing time of the ink, the evaporation rate of the ink solvents, the distance between the print head(s) containing the first ink-jet conducting ink of the metal particles or metallic polymer paste and the second print head comprising the second, thermoset resin and board forming inkjet ink, and the like or a combination of factors comprising one or more of the foregoing.

In an embodiment, the volume of each droplet of the metallic (or metallic) ink, and/or the second, resin ink, can range from 0.5 to 300 picoLiter (pL), for example 1-4 pL and depended on the strength of the driving pulse and the properties of the ink. The waveform to expel a single droplet can be a 10V to about 70 V pulse, or about 16V to about 20V, and can be expelled at frequencies between about 2 kHz and about 500 kHz.

The 3D visualization file representing the printed circuit boards including built-in passive and embedded active components used for the fabrication of the printed circuit boards having the BGA chip package sockets therein, can be: an an ODB, an ODB++, an.asm, an STL, an IGES, a DXF, a DMIS, NC, a STEP, a Catia, a SolidWorks, a Autocad, a ProE, a 3D Studio, a Gerber, an EXCELLON file, a Rhino, a Altium, an Orcad, an or a file comprising one or more of the foregoing; and wherein file that represents at least one, substantially 2D layer (and uploaded to the library) can be, for example, a JPEG, a GIF, a TIFF, a BMP, a PDF file, or a combination comprising one or more of the foregoing.

The computer controlling the printing process described herein can comprise: a computer readable storage device storing computer readable program code embodied therewith, the computer readable program code when executed by at least one processor in a digital computing device causes a three-dimensional inkjet printing unit to perform the steps of: pre-process Computer-Aided Design/Computer-Aided Manufacturing (CAD/CAM) generated information (e.g., the 3D visualization file), associated with the AME circuit(s) described, thereby creating a library of a plurality of 2D files (in other words, the file that represents at least one, substantially 2D layer for printing the PCB); direct a stream of droplets of a metallic material (conductive ink e.g.,) from a second inkjet print head of the three-dimensional inkjet printing unit at a surface of a substrate; direct a stream of droplets of a DI resin material from a first inkjet print head at the surface of the substrate; alternatively or additionally direct a stream of droplets material from another inkjet print head (e.g., support ink); move the substrate relative to the inkjet heads in an X-Y plane of the substrate, wherein the step of moving the substrate relative to the inkjet heads in the X-Y plane of the substrate, for each of a plurality of layers (and/or the patterns of conductive or DI inkjet inks within each layer), is performed in a layer-by-layer fabrication of the AME circuit.

In addition, the computer program, can comprise program code means for carrying out any of the steps of the methods described herein, as well as a computer program product comprising program code means stored on a medium that can be read by a computer. Memory device(s) as used in the methods described herein can be any of various types of non-volatile memory devices or storage devices (in other words, memory devices that do not lose the information thereon in the absence of power). The term "memory device", or "memory storage device" is intended to encompass an installation medium, e.g., a CD-ROM, floppy disks, or tape device or a non-volatile memory such as a magnetic media, e.g., hard drives (mechanical or solid state), optical storage, or ROM, EPROM, FLASH, etc.

The memory storage device may comprise other types of memory as well, or combinations thereof. In addition, the memory medium may be located in a first computer in which the programs are executed (e.g., the 3D inkjet printer provided), and/or may be located in a second different computer which connects to the first computer over a network, such as the Internet. In the latter instance, the second computer may further provide program instructions to the first computer for execution. The term "memory device" can also include two or more memory devices which may reside in different locations, e.g., in different computers that are connected over a network. Accordingly, for example, the library can reside on a memory device that is remote from the CAM module coupled to the 3D inkjet printer provided, and be accessible by the 3D inkjet printer provided (for example, by a wide area network).

Unless specifically stated otherwise, as apparent from the following discussions, it is appreciated that throughout the specification discussions utilizing terms such as "processing," "loading," "in communication," "detecting," "calculating," "determining", "analyzing," or the like, refer to the action and/or processes of a computer or computing system, or similar electronic computing device, that manipulate and/or transform data represented as physical, such as a transistor architecture into other data similarly represented as physical structural (in other words, resin or metal/metallic) layers.

Furthermore, as used herein, the term "2D file library" refers to a given set of files that together define a single AME circuit having the BGA connector package sockets (SMP), and/or leaded SMT device socket therein, or a plurality of PCB having the BGA chip package sockets therein used for a given purpose. Furthermore, the term "2D file library" can also be used to refer to a plurality of vector data models and/or bitmaps, each vector data model and/or bitmap specific for a predetermined layer or their interface and/or cross section in the form of a set of 2D files or any other raster graphic file format (the representation of images as a collection of pixels, generally in the form of a rectangular grid, e.g., BMP, PNG, TIFF, GIF), capable of being indexed, searched, and reassembled to provide the structural layers of a given AME circuit, whether the search is for the AME circuit as a whole, or a given specific layer within the AME circuit.

The Computer-Aided Design/Computer-Aided Manufacturing (CAD/CAM) generated information associated with the PCB having the BGA chip package sockets therein components described herein to be fabricated, which is used in the methods, programs and libraries can be based on converted CAD/CAM data packages can be, for example, IGES, DXF, DWG, DMIS, NC files, GERBER® files, EXCELLON®, STL, EPRT files, an ODB, an ODB++, an.asm, an STL, an IGES, a STEP, a Catia, a SolidWorks, a Autocad, a ProE, a 3D Studio, a Gerber, a Rhino a Altium, an Orcad, an Eagle file or a package comprising one or more of the foregoing. Additionally, attributes attached to the graphics objects transfer the meta-information needed for fabrication and can precisely define the PCBs. Accordingly and in an embodiment, using pre-processing algorithm, GERBER®, EXCELLON®, DWG, DXF, STL, EPRT ASM, and the like as described herein, are converted to 2D files.

Moreover, the contacts fabricated using the methods described herein can be coupled to traces at any layer, or combination of layers, for example, using plated/filled vias (through-hole, blind, or buried), connected through various layers (intermediate or external).

A more complete understanding of the components, processes, assemblies, and devices disclosed herein can be obtained by reference to the accompanying drawings. These figures (also referred to herein as "FIG.s") are merely schematic representations (e.g., illustrations) based on convenience and the ease of demonstrating the present disclosure, and are, therefore, not intended to indicate relative size and dimensions of the devices or components thereof and/or to define or limit the scope of the exemplary embodiments. Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function and/or composition and/or structure.

Turning to FIGS. 1-5B illustrating in FIG. 1, a perspective view of AME circuit (used interchangeably with PCB, FPC and HDIPCB) 10. PCB 10 having upper outer surface 101, and a basal outer surface, where each of the raised frame pit 110 sunk pit 210, or leaded SMT device socket 220 (see e.g., FIG. 5A) can be integrated. As illustrated, AME 10 comprises raised frame 110 having side walls 111 extending externally (apically from the upper outer surface 101, or basally from basal outer surface 102 of the AME 10, the raised frame defining framed pit 110, or partially framed pit 110' (see e.g., FIG. 4) having side walls 112 and floor 113, wherein the floor, which can be on the same or different plane as upper outer surface 101, defines a well array having a plurality of wells 114j, each well, operating as a surface mounting pad configured to receive and accommodate a soldering medium. Also illustrated are traces 103i, connecting each solder mounting pad or well 114j, to a predetermined designated location 120p using e.g., plated or filled vias, such as through hole via, blind via, or buried via. An enlarged illustration of the raised framed pit is illustrated in FIG. 2A. showing the pit walls 112, which can have a depth of between about 0.25 mm and about 1.00 mm, the pit being operable to engage and/or accommodate a portion of the BGA connector chip package, holding it in place during the soldering process. The spatial dimensions (opening area) of the pit opening can be predetermined based on target chip package (See e.g., FIGS. 5E, 5F) sought to be coupled to AME 10.

Figure 2A:
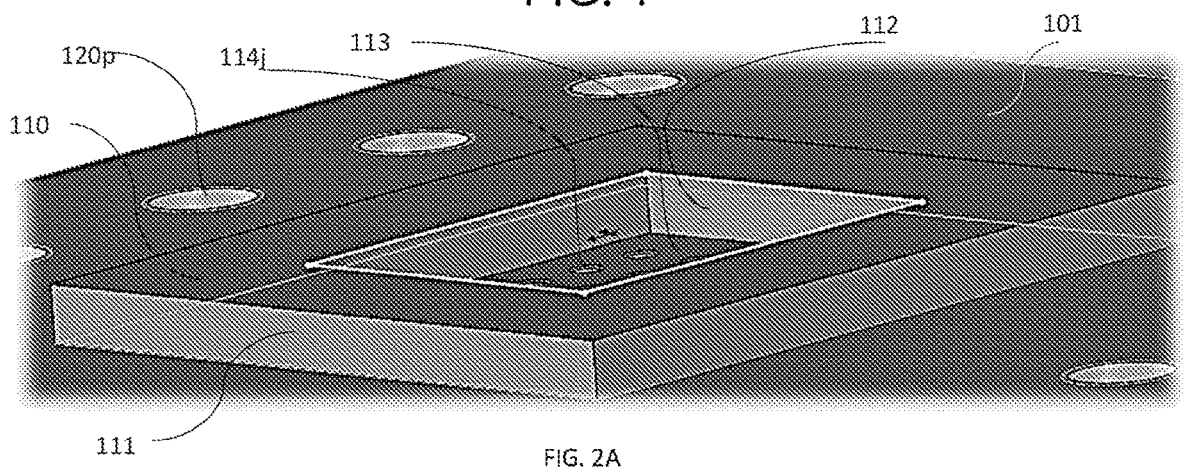
FIG. 2A, is an isometric schematic view of an enlarged raised framed pit in FIG. 1, fabricated using the methods disclosed, with FIG. 2B, illustrating a surface mounting pad fabricated using the disclosed methods.
Figure 2B:
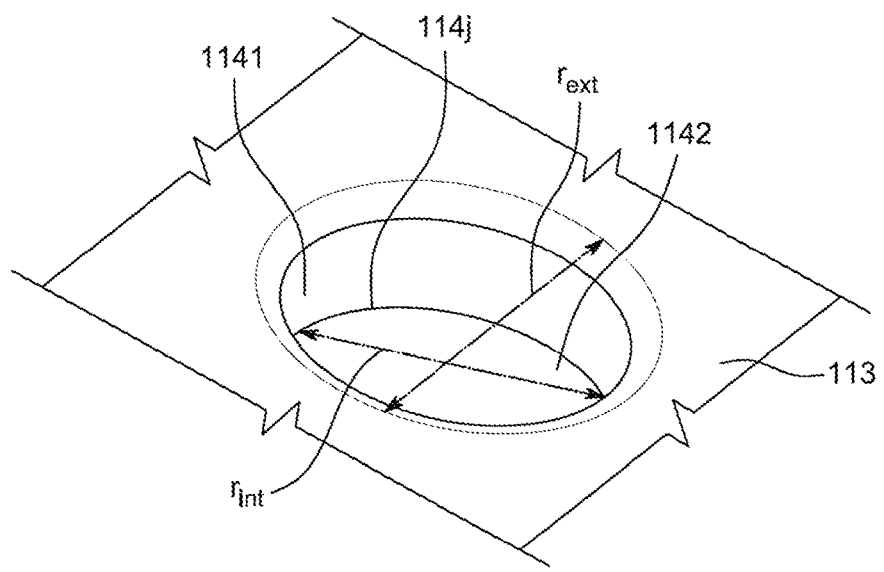
Figure 3:
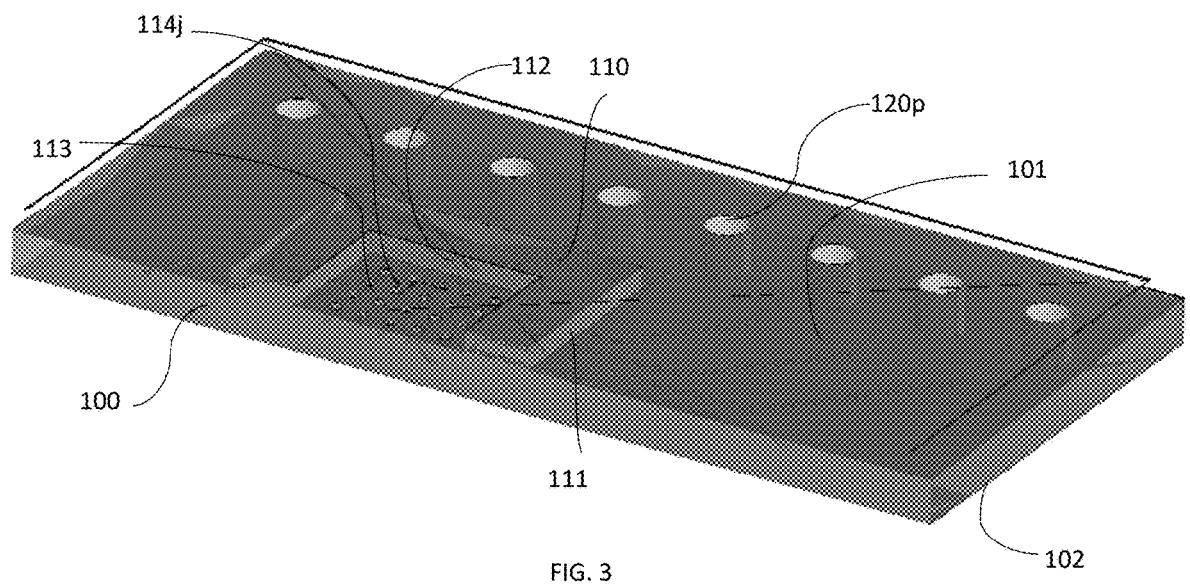
FIG. 3, is a cross section of the AME circuit illustrated in FIG. 1.

Turning now to FIG. 2B, illustrating enlarged well 114j, operating as a surface mounting pad (SMP), showing cylindrical well walls 1141 defining apical opening having diameter $r_{ext}$, with solder junction 1142, having internal diameter $r_{int}$. As indicated when the ratio between $r_{ext}/r_{int}$ is less than one, the well operates as a SMD. In the example illustrated in FIG. 2B, the ratio between $r_{ext}/r_{int}$ is larger than one, making the well an example of NMSD, with beveled edges to cylindrical walls 1141 opening to pit floor 113. Another view is provided in FIG. 3, showing a cross section of AME 10 illustrated in FIG. 1. External diameter $r_{ext}$, can be between about 15 µm and about 1000 µm, or between about 100 µm and about 700 µm, for example; between about 250 µm and about 600 µm. Likewise ball (or bump, or pin) pitch (see e.g., FIG. 5A), defined as the distance between the centers of any two adjacent $j^{th}$ 114j wells, which can be the same or different in the array, can be between about 20 µm and about 1750 µm, or between about 250 µm and about 1500 µm, for example, between about 500 µm and about 1250 µm, or between about 900 µm and about 1100 µm.

Figure 4:
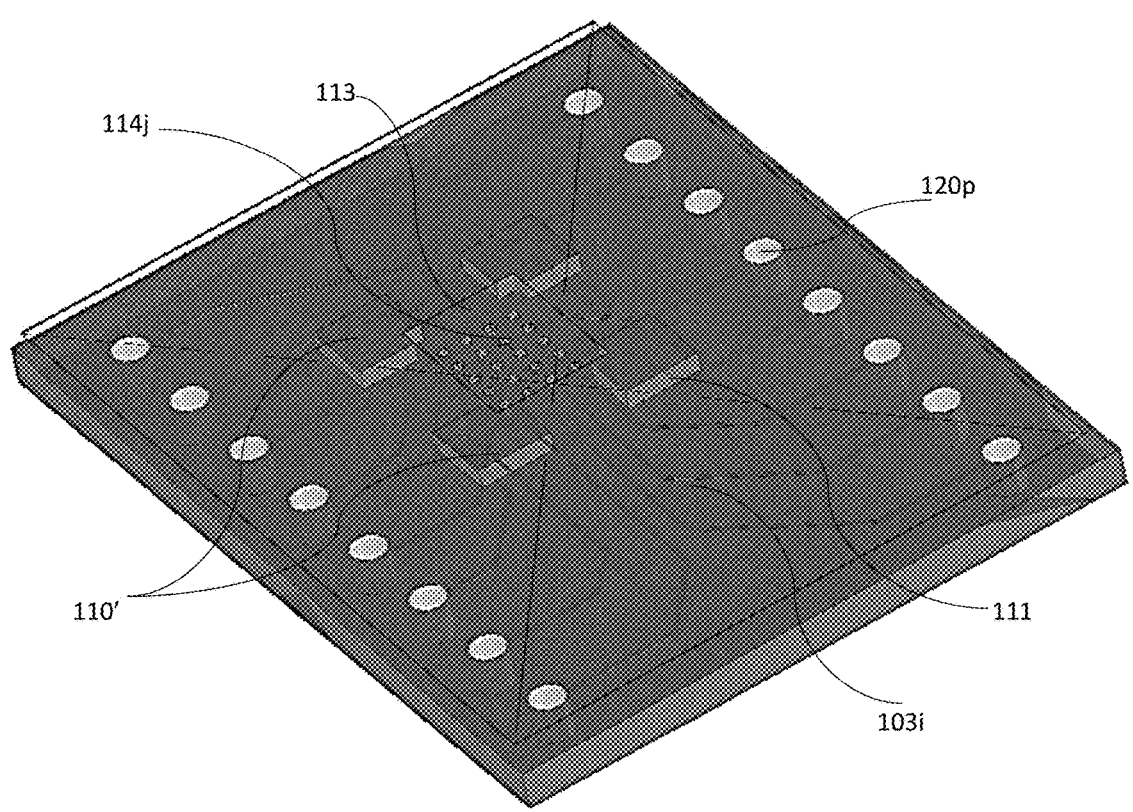
FIG. 4 is an isometric schematic view of another configuration of the AME circuit fabricated using the disclosed methods, whereby the raised framed pit is a partial frame.

Turning now to FIG. 4, depending on the size of the BGA connector chip package or leaded (in other words, IC package with legs, or "leads") SMT device, it may be desirable to print or AM fabricate a partial frame. Although sown in an example with four (4) partial corners, using two diagonal corners is also contemplated, with the purpose being to engage the housing of the BGA/SMT chip package (see e.g., 221, 222, FIG. 5A).

Figure 5A:
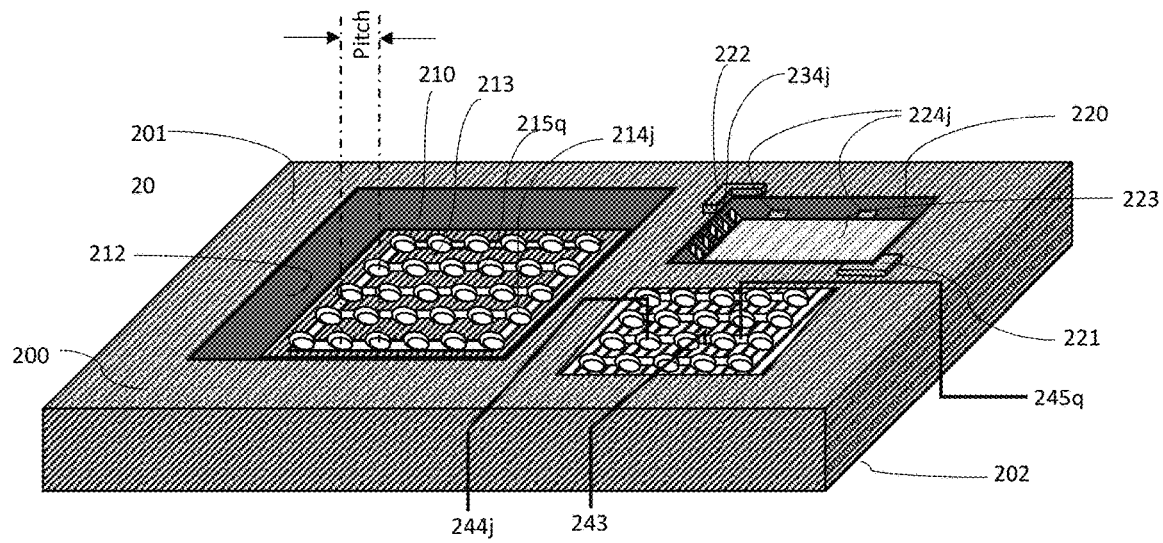
FIG. 5A is a schematic illustration of a BGA socket fabricated using the disclosed method, showing groove (or channels) for solder reflow collection, with FIGS. 5B-5F illustrating some examples of the BGA and SMT components that can be coupled using the technology.
Figures 5B, 5C, 5D:
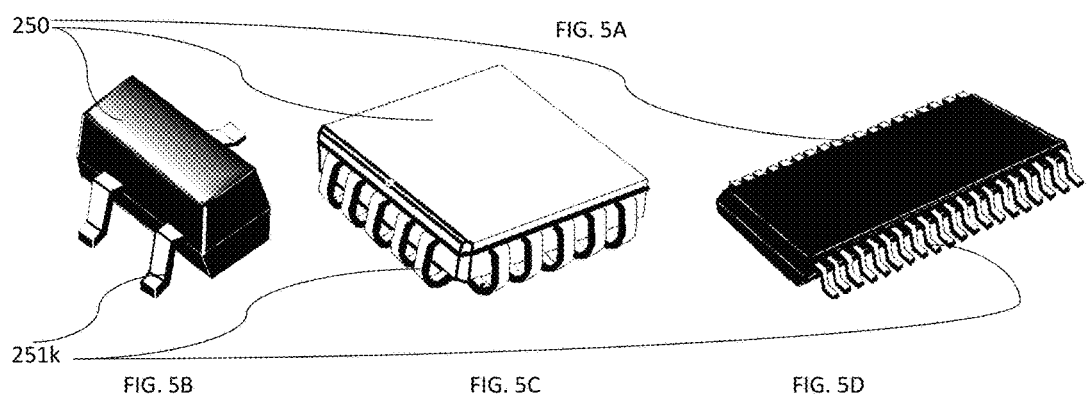

Turning to FIG. 5, illustrating in FIG. 5A-AME 20 showing sunk pit 210, having side walls 212. extending internally from an outer surface 201 (and/or 202) of AME 20 to pit floor 213 wherein the floor 213 defines a well array 214j having a plurality of wells, each configured to receive, engage and accommodate a soldering medium (not shown). Also shown is groove 215q, forming and maintaining liquid communication among wells 214j, configured to receive, when used, excess solder reflow material (not shown), for example, solder flux. Also shown in FIGS. 5B-5D, is SMT device's chip package 250, before soldering to AME 20. FIG. 5B shows an example of SMT device package that was coupled (not shown) to raised frame pit 110 fabricated using the disclosed systems and methods and which 3D visualization file is illustrated in FIG. 1.

Grooves 215q can have a width of between about 15 µm and 1000 µm, or between about 100 µm and about 700 µm, for example; between about 250 µm and about 600 µm. or between about 400 µm and about 550 µm, and will depend on, for example, at least one of the external diameter $r_{ext}$ of the $j^{th}$ well 214j, and the viscosity of the soldering paste and/or flux.

Figures 5E, 5F:
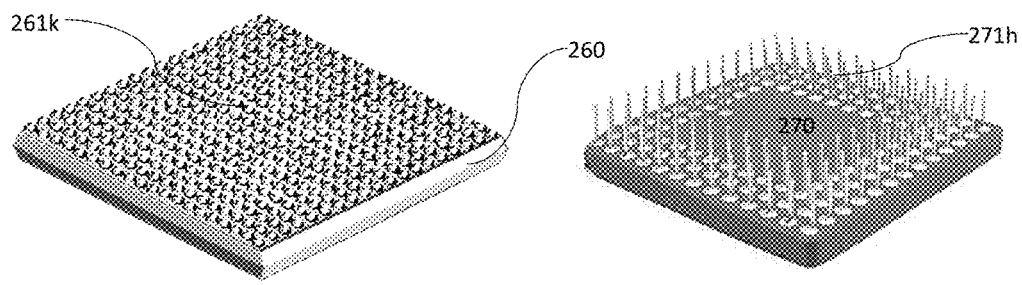
Figure 6:
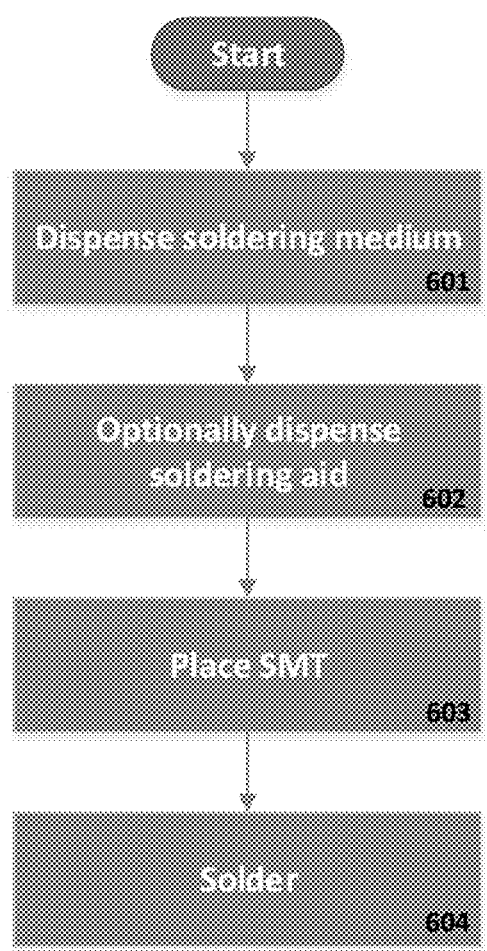
FIG. 6, is a flow chart for coupling the IC package to the socket fabricated using the disclosed methods.

Turning now to FIG. 6, illustrating the method portion that was used in soldering leads 251 in FIG. 5B, to the well array 114j of FIG. 1. As shown, low melt temperature soldering paste was dispensed 601 into pit floor 113, filling well array 114j and the excess was cleaned, after which soldering aid, for example soldering reflow flux was dispensed 602, to cover all the wells with the excess cleaned. Next SMTs 250, shown in FIG. 5B-5E, was placed into 603 raised framed pit 110, 210, or 220 (See e.g., FIG. 5A) such that leads 251k entered well array 114j, 224j, or 234j and soldered in reflow oven 604. The low melt temperature soldering paste can be lead-free, for example an alloy of tin (Sn) and bismuth (Bi), or Indium (In); at a ratio of about 2:3, with or without an additional metal up to 3%, such as silver (Ag) or copper (Cu), providing a melting temperature of between about 120° C. and about 140° C., with peak reflow temperature between about 140° C. and about 170° C., depending on composition. An even lower meting temperature of less than 100° C. can be obtained using mixtures of lead with tin and bismuth, however these should be avoided in AME circuit application where components' use can lead to heating over the mixture melting temperature ($T_m$), which can lead to joint failure. In certain configurations, a design rule for the AME circuit includes a safety margin of at least 50° C. between the melting temperature of the soldering medium, and the operating temperature of the AME circuit.

Accordingly, the methods disclosed and claimed herein can similarly be used to fabricate sockets for other surface-mounted devices (SMTs), whereby the systems and methods provided herein can be used to fabricate the land sockets for various rectangular, square, and any other surface mounted device (e.g., hexagonal chip packages). in addition, the disclosed socket structures can be configured to be used in circuits fabricated and assembled using "pick-and-place" systems.

The surface-mounting pads (well array) thus formed can have any polygonal shape and be sized and configured to accommodate any shape and size of SMTs. As illustrated in FIG. 5E, BGA connector package can be placed and engaged in pit (socket), 210, where well array 214j is configured as a complementary surface to solder chip package 260, for example MAPBGA, WLCSP, LGA, Flip Chip BGA connector package(s), with either SMD or NSMD wells (surface mounting pads). As further illustrated in FIG. 5A, well (surface mounting sockets) array 224j, or 234j can be configured to accommodate and engage leads from various other chip packages, for example SOTs (see e.g., FIG. 5B), where slots 224j operate as the well array disclosed, or in other words, the integrally fabricated surface mounting sockets, including the traces and vias routed to their proper destination. Likewise, PLCCs (see e.g., FIG. 5C) J-leads can be accommodated within the pit and be configured to engage the J-leads (for example) at the proper pitch 234j. Similarly to the SOT's, slots 224j can be sized and configured to accommodate (gull wing shaped) leads of QFP, SOIC and TSOP.

Although as illustrated, the well array is illustrated solely on the floor of the pits (sunk and/or raised), it is contemplated that in certain exemplary implementations, the well array having round cross section can be defined in the side walls 212 and be configured to operably couple to peripherally disposed bumps or spheres, such as, for example, those in certain flip-chips.

In fabricating the SMP and/or sockets disclosed herein, the 3D visualization file can be configured to provide the data necessary to fabricate each SMP and/or socket automatically. The data may comprise, inter-alia; package type (QFP, SOP, TSOP, MAPBGA etc.), lead type (J-type, Gull wing, bumps/balls etc.), X-Y dimensions (TSOPs can have the same number of leads, but different length and width), pins/pins out/footprint. quantity and topology.

The sockets fabricated with the disclosed methods and system can be sized and configured to accommodate various lead types. For example, Gull-wing leads are used to get for example large number of leads onto an IC. For example the fabrication method implemented in the systems disclosed can be used to get 40 to 80 leads' socket per linear inch (15 to 33 leads per cm, in other words, the lead pitch) coupling an IC using gull-wing leads. Gull-wing leads are easy to inspect after soldering. Furthermore, sockets for J-leads, which take up more space than Gull-wing leads can also be fabricated, whereby 20 leads per linear inch (8 leads per cm or a lead pitch of about 1350 μm) present on an IC package (e.g., PLCC). Easier still, are sockets for flat leads whether the leads are cut and bent into gull-wings prior to soldering by using lead forming equipment. Using the methods and systems provided herein, whereby the sockets are sized and adapted to receive the flat leads without the need to bend the flat leads, thus saving time. Lead forming equipment is an extra expense. As used herein, "lead pitch" is synonymous with "lead space".

Also shown in FIG. 5A, is an example of socket 243, having thereon well array (or SMP array) 244j with channels 245q for collecting solder reflow material. Socket 243 does not have any frame, nor is it sunk into top surface 201 of AME 20, but rather is flush with upper surface 201. Socket 243 can have solder mounting pads that do not have circular cross-section, but rather a slit, or quadrilateral cross section and are configured to accommodate other lead types as discussed herein. The unframed, flush (on the same plane) SMP can be used in conjunction with a "pick-and-place" robotic system, referring to a mechanism for moving, and in some cases, holding, one or more circuit assemblies within manufacturing or test equipment. For example, a pick and place arm may move a circuit assembly (e.g., flip-chip 5E), from a circuit assembly carrier to socket 243. The actual mechanism may take any suitable form, including, for example, three-dimensional table-based arms, two-dimensional table-based arms, robotic arms on a fixed base and/or rotational transfer devices.

As further illustrated in FIG. 5A, the raised frame can be partial and have two diagonal corners 221, 222, configured to (for example, frictionally) engage SMT body 250.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the print head(s) includes one or more print head). Reference throughout the specification to "one embodiment", "another embodiment", "an embodiment", and so forth, when present, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Accordingly, provided herein is an additively manufactured electronic (AME) circuit that is operable as at least one of: a printed circuit board (PCB), flexible printed circuit (FPC), and a high-density interconnect PCB (HDIPCB), the AME circuit further comprising a sunk pit having side walls. extending internally from an outer surface of the AME circuit, to a pit floor wherein the floor and/or the side walls define(s) a well array having a plurality of wells (or slots, or recesses, dimples and other depressions), each well configured to receive and accommodate a soldering medium and connect to a conductive trace using, for example a plated and/or filled via, such as a through-hole via, a blind via and/or a buried via, and a raised (in other words, above the circuit's external plane) frame having side walls extending externally from the outer surface of the AME circuit, the raised frame defining a framed pit having side walls and a floor, wherein the floor, and/or the side walls define(s) a well array having a plurality of wells, each configured to receive and accommodate a soldering medium, wherein, the sunk pit and/or the raised framed pit, having the well array defined therein is operable to couple and connect a ball grid array (BGA) connector package, and/or any other surface mounted device (SMT) package, the sunk and/or raised pits each operable as a surface mounting pad (SMP) or surface mounting socket, wherein (i) the raised frame is a partial frame, wherein (ii) at least one well in the well array of the sunk pit and/or the raised framed pit is operable as a solder-mask defined mounting pad (SMDM whereby the opening of the well ($r_{ext}$) is smaller than the diameter of the well ($r_{int}$)) or (iii) alternatively, Non-SMD (whereby the opening of the well ($r_{ext}$) is larger than the diameter of the well ($r_{int}$)), wherein (iv) the soldering medium is a soldering paste, and/or a solder ball, wherein (v) at least one well in the well array of the sunk pit and/or the raised framed pit well array, has a depth of between about 50 µm and about 150 µm, and an internal diameter between about 50 µm and about 1000 µm. with external diameter of between about 50 µm and about 1250 µm, wherein (vi) the the sunk pit floor, and/or the raised framed pit floor, each further defines a groove, sized and configured to receive a solder reflow material, and wherein (vii) the grooves form a network that is adapted to maintain fluid communication among a plurality of wells.

In another exemplary implementation, provided herein is a method for fabricating additively manufactured electronic (AME) circuit, that a printed circuit board (PCB), and/or a flexible printed circuit (FPC), and/or a high-density interconnect printed circuit board (HDIPCB), each comprising: a sunk pit having side walls, extending internally from an outer (apical, basal, lateral) surface of the AME circuit, to a pit floor wherein the floor defines a well array, configured to receive and accommodate a soldering medium, and/or raised frame having side walls extending externally from the outer (apical, basal, lateral) surface of the AME circuit, the raised frame defining a raised framed pit having side walls and a floor, the floor defines the raised frame pit well array (which can be the same or different than the well array in the sunk pit), configured to receive and accommodate the soldering medium, wherein, each one of the sunk pit and the raised framed pit, is operable to couple at least one ball grid array (BGA) connector package, and/or a surface mounted technology (SMT) package, the method comprising: providing an ink jet printing system having: a first print head adapted to dispense a dielectric ink (DI); a second print head adapted to dispense a conductive ink (CI); a conveyor, operably coupled to the first and second print heads, operable to convey a substrate (coupled e.g., to a chuck), to each print heads; and a computer aided manufacturing ("CAM") module, in communication with each of the first, and second print heads, the CAM further comprising a central processing module (CPM) including at least one processor, in communication with a non-transitory computer readable storage device configured to store instructions that, when executed by the at least one processor cause the CAM to control the ink-jet printing system, by carrying out steps that comprise: receiving a 3D visualization file (e.g., Gerber file) representing the AME circuit comprising the sunk pit, and/or the raised frame pit; and generating a file library of a plurality of files, each file representing a substantially functional 2D layer for printing the AME circuit comprising the sunk pit, and/or the raised frame pit, as well as a metafile associated with each raster 2D functional layer file, representing at least the printing order; providing the DI and the CI composition; using the CAM module, obtaining a first layer file; using the first print head, forming the pattern corresponding to the DI in the first layer; curing the pattern corresponding to the DI; using the second print head, forming the pattern corresponding to the CI, the pattern further corresponding to the substantially 2D layer for printing of the AME circuit comprising the sunk pit, and/or the raised frame pit; sintering the pattern corresponding to the CI; using the CAM module, obtaining from the library a file representative of a subsequent layer for printing the AME circuit, the subsequent file comprising printing instructions for a pattern representative of the dielectric ink, and/or the conductive ink; repeating the steps of: using the first print head, forming the pattern corresponding to the dielectric ink, to the step of using the CAM module, obtaining from the 2D file library the subsequent, substantially 2D layer, wherein upon printing the final layer, the AME circuit comprising the at least one of: the sunk pit, and the raised frame pit, operable to mount at least one BGA connector package component, and/or at least one SMT device; and optionally coupling the at least one of: the BGA connector package, and the SMT device package, the method further comprising (viii) applying soldering medium to the well array of the sunk pit and/or the raised framed pit; optionally applying solder reflow material (in other words, solder paste such as a 2:3 Tin:Bismuth composition); coupling the BGA connector package, and/or the SMT device package to the raised framed pit, and/or the sunk pit, wherein the BGA connector package, and/or the SMT device package further comprise a plurality of extensions, bumps, balls, leads, legs, pin array and the like, each configured to partially enter a corresponding well, recess, slot, dimple and like connected (e.g., with vias to traces) depressions: and soldering the BGA connector package, and/or the SMT device package in the appropriate SMP or the surface mounting socket, wherein (ix) the pattern corresponding to the dielectric ink portion of the at least one of the sunk pit floor and the raised framed pit floor, is configured to further define a plurality of grooves, the plurality of groove, when fully formed, are each sized and configured to receive the solder reflow material (in other words, the solder material referring to the molten solder paste, solder bumps, and solder balls), and wherein the plurality of groove form a network configured to maintain fluid communication among a plurality of wells, wherein, (x) the soldering medium is a soldering paste and wherein the step of applying the soldering material is followed by a step of removing excess paste, wherein (xi) at least one well in the well array of the sunk pit and/or the raised framed pit is sized and configured as a solder-mask defined mounting pad, or (xii) as a non-solder-mask defined mounting pad, and wherein alternatively, (xiii) the soldering medium is solder balls.

Although the foregoing disclosure for the AME circuits, comprising the BGA and/or SMT chip package sockets therein, using inkjet printing based on converted 3D visualization CAD/CAM data packages has been described in terms of some embodiments, other embodiments will be apparent to those of ordinary skill in the art from the disclosure herein. Moreover, the described embodiments have been presented by way of example only, and are not intended to limit the scope of the inventions. Indeed, the novel methods, programs, libraries and systems described herein may be embodied in a variety of other forms without departing from the spirit thereof. Accordingly, other combinations, omissions, substitutions and modifications will be apparent to the skilled artisan in view of the disclosure herein.

What is claimed is:

1. An additively manufactured electronic (AME) circuit comprising at least one of a printed circuit board (PCB), flexible printed circuit (FPC), and a high-density interconnect PCB (HDIPCB), the AME circuit comprising at least one of:
    a. a sunk pit having side walls. extending internally from an outer surface of the AME circuit, to a pit floor wherein at least one of the floor, and the side walls define(s) a well array having a plurality of wells, each well configured to receive and accommodate a soldering medium, and
    b. a raised frame having side walls extending externally from the outer surface of the AME circuit, the raised frame defining a framed pit having side walls and a floor, wherein at least one of the floor, and the side walls define(s) a well array having a plurality of wells, each configured to receive and accommodate a soldering medium,
    wherein, each of the sunk pit and the raised framed pit, having the well array defined therein is sized and configured to operably couple at least one of: a ball grid array (BGA) package, and any other surface mounted device (SMT) package.

2. The AME circuit of claim 1, wherein the raised frame is a partial frame.

3. The AME circuit of claim 2, wherein at least one well in the well array of the sunk pit and/or the raised framed pit is operable as a solder-mask defined mounting pad.

4. The AME circuit of claim 2, wherein at least one well in the well array of the sunk pit and/or the raised framed pit is operable as a non-solder-mask defined mounting pad.

5. The AME circuit of claim 4, wherein the soldering medium is at least one of: a soldering paste, and a solder ball.

6. The AME circuit of claim 5, wherein at least one well in the well array of the sunk pit and/or the raised framed pit well array, has a depth of between about 50 μm and about 150 μm.

7. The AME circuit of claim 6, wherein the at least one of the sunk pit floor and the raised framed pit floor, each further defines a groove, sized and configured to receive a solder reflow material.

8. The AME circuit of claim 7, wherein the groove is adapted to maintain fluid communication among a plurality of wells.

9. A method for fabricating additively manufactured electronic (AME) circuit, that is at least one of: a printed circuit board (PCB), a flexible printed circuit (FPC), and a high-density interconnect printed circuit board (HDIPCB), each comprising at least one of: a sunk pit having side walls, extending internally from an outer surface of the AME circuit, to a pit floor wherein the floor defines a well array, configured to receive and accommodate a soldering medium, and raised frame having side walls extending externally from the outer surface of the AME circuit, the raised frame defining a raised framed pit having side walls and a floor, the floor defines the well array, configured to receive and accommodate the soldering medium, wherein, each one of the sunk pit and the raised framed pit, is operable to couple at least one of a ball grid array (BGA) package, and a surface mounted technology (SMT) package, the method comprising:
    a. providing an ink jet printing system having:
        i. a first print head adapted to dispense a dielectric ink;
        ii. a second print head adapted to dispense a conductive ink;
        iii. a conveyor, operably coupled to the first and second print heads, configured to convey a substrate to each print heads; and
        iv. a computer aided manufacturing ("CAM") module, in communication with each of the first, and second print heads, the CAM further comprising a central processing module (CPM) including at least one processor, in communication with a non-transitory computer readable storage device configured to store instructions that, when executed by the at least one processor cause the CAM to control the ink-jet printing system, by carrying out steps that comprise: receiving a 3D visualization file representing the AME circuit comprising the at least one of: the sunk pit, and the raised frame pit; and generating a file library having a plurality of files, each file representing a substantially 2D layer for printing the AME circuit comprising the at least one of: the sunk pit, and the raised frame pit, and a metafile representing at least the printing order;
    b. providing the dielectric inkjet ink composition, and the conductive inkjet ink composition;
    c. using the CAM module, obtaining a first layer file;
    d. using the first print head, forming the pattern corresponding to the dielectric inkjet ink;
    e. curing the pattern corresponding to the dielectric inkjet ink;
    f. using the second print head, forming the pattern corresponding to the conductive ink, the pattern further corresponding to the substantially 2D layer for printing of the AME circuit comprising the at least one of: the sunk pit, and the raised frame pit;
    g. sintering the pattern corresponding to the conductive inkjet ink;
    h. using the CAM module, obtaining from the library a subsequent file representative of a subsequent layer for printing the AME circuit comprising the at least one of: the sunk pit, and the raised frame pit, the subsequent file comprising printing instructions for a pattern representative of at least one of: the dielectric ink, and the conductive ink;
    i. repeating the steps of: using the first print head, forming the pattern corresponding to the dielectric ink, to the step of using the CAM module, obtaining from the 2D file library the subsequent, substantially 2D layer, wherein upon printing the final layer, the AME circuit comprising the at least one of: the sunk pit, and the raised frame pit, operable to mount at least one BGA connector package component, and/or at least one SMT device; and j. optionally coupling the at least one of: the BGA connector package, and the SMT device package.

10. The method of claim 9, further comprising:
a. applying soldering medium to the well array of the at least one of the sunk pit and the raised framed pit;
b. optionally applying solder reflow material;
c. coupling the at least one of: the BGA connector package, and the SMT device package to the at least one of: the raised framed pit, and the sunk pit, wherein each of the at least one of: the BGA connector package, and the SMT device package further comprise a plurality of extensions, each extension configured to partially enter a corresponding well: and
d. soldering the at least one of: the BGA connector package, and the SMT device package.

11. The method of claim 10, wherein the pattern corresponding to the dielectric ink portion of the at least one of the sunk pit floor and the raised framed pit floor, is configured to further define a plurality of grooves, the plurality of groove, when fully formed, are each sized and configured to receive the solder reflow material and wherein the plurality of groove form a network configured to maintain fluid communication among a plurality of wells.

12. The method of claim 11, wherein the soldering medium is a soldering paste and wherein the step of applying the soldering material is followed by a step of removing excess paste.

13. The method of claim 10, wherein the soldering medium is solder balls.

14. The method of claim 9, wherein at least one well in the well array of the sunk pit and/or the raised framed pit is sized and configured as a solder-mask defined mounting pad.

15. The method of claim 9, wherein at least one well in the well array of the sunk pit and/or the raised framed pit is sized and configured as a non-solder-mask defined mounting pad.

* * * * *